United States Patent
Fu et al.

(10) Patent No.: US 8,677,292 B2
(45) Date of Patent: Mar. 18, 2014

(54) CELL-CONTEXT AWARE INTEGRATED CIRCUIT DESIGN

(75) Inventors: Chung-Min Fu, Taoyuan (TW); Yen-Pin Chen, Taipei (TW); Yung-Fong Lu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 549 days.

(21) Appl. No.: 12/708,098

(22) Filed: Feb. 18, 2010

(65) Prior Publication Data

US 2010/0275167 A1    Oct. 28, 2010

Related U.S. Application Data

(60) Provisional application No. 61/171,711, filed on Apr. 22, 2009.

(51) Int. Cl.
*G06F 17/50* (2006.01)
(52) U.S. Cl.
USPC ............................................ 716/102; 716/119
(58) Field of Classification Search
USPC ..................... 716/110, 119, 120, 126, 132
See application file for complete search history.

(56) References Cited

U.S. PATENT DOCUMENTS

| | | | | |
|---|---|---|---|---|
| 7,185,303 | B2 * | 2/2007 | Fukasawa | 716/122 |
| 7,685,545 | B2 * | 3/2010 | Chapman et al. | 716/136 |
| 2007/0022400 | A1 * | 1/2007 | Kadota | 716/13 |
| 2007/0094622 | A1 * | 4/2007 | Lee et al. | 716/4 |
| 2009/0307640 | A1 * | 12/2009 | Chapman et al. | 716/4 |
| 2010/0050140 | A1 * | 2/2010 | Chang et al. | 716/6 |

OTHER PUBLICATIONS

Yang, J., et al., "Advanced Timing Analysis Based on Post-OPC Extraction of Critical Dimensions," Design Automation Conference, Jun. 13-17, 2005, Anaheim, California, pp. 359-364.
Kahng, A., "Key Directions and a Roadmap for Electrical Design for Manufacturability," IEEE, 2007, pp. 83-88.

* cited by examiner

*Primary Examiner* — Vuthe Siek
*Assistant Examiner* — Mohammed Alam
(74) *Attorney, Agent, or Firm* — Slater & Matsil, L.L.P.

(57) ABSTRACT

A method of designing an integrated circuit includes providing a standard cell database including a plurality of standard cells; providing an index file having cell-context information indexed to the plurality of standard cells; retrieving the cell-context information of one of the plurality of standard cells from the cell-context file; and applying the index information to a design of the integrated circuit.

26 Claims, 4 Drawing Sheets

| Cell name | Abutted | Isolated |
|---|---|---|
| Cell8 | 11.35 | 9.35 |
| Cellx | 4.7 | 2.20 |
| Celly | 3.51 | 2.51 |

| Cell name | Isolated | Abutted to class1 cells | Abutted to class2 cells |
|---|---|---|---|
| Cell8 | 9.35 | A1 | B1 |
| Cellx | 2.20 | A2 | B2 |
| Celly | 2.51 | A3 | B3 |

| Cell name | Derate-Rise | Derate-Fall |
|---|---|---|
| Cell8 | 0.99 | 0.99 |
| Cell9 | 1.1 | 1.12 |
| Cell6 | 0.99 | 0.97 |
| Cell3 | 0.99 | 0.96 |

CELL-CONTEXT AWARE INTEGRATED CIRCUIT DESIGN

This application claims the benefit of U.S. Provisional Application No. 61/171,711 filed on Apr. 22, 2009, entitled "Cell-Context Aware Integrated Circuit Design," which application is hereby incorporated herein by reference.

TECHNICAL FIELD

This invention relates generally to integrated circuits, and more particularly to the placement-and-route of integrated circuits, and even more particularly to optimizing placement-and-route based on cell-context information.

BACKGROUND

In the design of modern integrated circuits, particularly digital circuits, standard cells having fixed functions are widely used. Standard cells are often pre-designed, characterized, and saved in cell libraries. At the time integrated circuits (applications) are designed, the standard cells are retrieved from the cell libraries and placed into desirable locations. Routing is then performed to connect the standard cells with each other, and with other customized circuits on the same chip.

The performance and the routability of standard cells are affected by the cells' neighboring environment (referred to as cell-context hereinafter) in which they are located. For example, the cell's performance is affected by well proximity, poly spacing, stress and/or lithographic effects, and boundary conditions that are related to the actual cell abutting scenarios. The routability in a design is also determined based on actual placement situations of standard cells, such as whether they are placed loosely, tightly, or mixed with loose placement and tight placement. However, conventional integrated circuit design did not take the cell-context into consideration. Rather, conventional integrated circuit design was rule based with a set of pre-defined design rules guiding the design.

The design rules may specify where and how standard cells can or cannot be placed and routed. The rule-based approach means that all standard cells are subject to the same rules, and the cell-context, which is specific to each of the standard cells, is not considered. For example, the placement rules may require that in a specific integrated circuit design, that filler cells (or spaces) are added next to all standard cells, which requires white spaces and incur area penalty. Further, the rule-based design may require spare cells to be inserted, which causes higher power consumption. Sometimes, there is even no white space available, and hence it is impossible to successfully place and route cells without incurring performance degradation. In this situation, design re-spin interactions must be repeated to solve these issues. New integrated circuit design methods are thus needed to solve the above-discussed problems.

SUMMARY OF THE INVENTION

In accordance with one aspect of the present invention, a method of designing an integrated circuit includes providing a standard cell database including a plurality of standard cells; providing an index file having cell-context information indexed to the plurality of standard cells; retrieving the cell-context information of one of the plurality of standard cells from the index file; and applying the cell-context information to a design of the integrated circuit.

In accordance with another aspect of the present invention, a method of designing an integrated circuit includes providing a standard cell database including a plurality of standard cells; providing a routability index file including routability indexes associated with the plurality of standard cells; and retrieving a routability index from the routability index file. The routability index corresponds to a selected standard cell in the plurality of standard cells and used in the integrated circuit. The method further includes calculating a value based on the routability index; and inserting a space to a side of the selected standard cell, wherein a dimension of the space is equal to the calculated value.

In accordance with yet another aspect of the present invention, a method of designing an integrated circuit includes providing a standard cell database including a plurality of standard cells; providing a performance index file including performance indexes associated with the plurality of standard cells; and retrieving a performance index from the performance index file. The performance index corresponds to a selected standard cell in the plurality of standard cells and used in the integrated circuit. The method further includes evaluating a performance of the integrated circuit using the performance index.

In accordance with yet another aspect of the present invention, a system for designing an integrated circuit includes a standard cell database including a plurality of standard cells, and a routability index file. In the routability index file, each of the plurality of standard cells is associated with a routability index.

In accordance with yet another aspect of the present invention, a system for designing an integrated circuit includes a standard cell database including a plurality of standard cells, and a performance index file. In the performance index file, each of the plurality of standard cells is associated with a performance index.

The advantageous features of the present invention include cell-context aware design guidance for reducing the area penalty, reducing power consumption, and improving flexibility and expandability in integrated circuit design implementation. Cell-level designers may also refer to the indexes for improving cell design in order to enhance robustness.

BRIEF DESCRIPTION OF THE DRAWINGS

For a more complete understanding of the present invention, and the advantages thereof, reference is now made to the following descriptions taken in conjunction with the accompanying drawings, in which:

FIGS. 4A and 4B illustrate exemplary routability index tables in cell-context characterization files;

DETAILED DESCRIPTION OF ILLUSTRATIVE EMBODIMENTS

The making and using of the embodiments of the present invention are discussed in detail below. It should be appreciated, however, that the embodiments provide many applicable inventive concepts that can be embodied in a wide variety of specific contexts. The specific embodiments discussed are merely illustrative of specific ways to make and use the invention and do not limit the scope of the invention.

A novel cell-context aware integrated circuit design method is provided. The variations of the embodiment are then discussed. Throughout the various views and illustrative embodiments of the present invention, like reference numbers are used to designate like elements.

Figure 1:
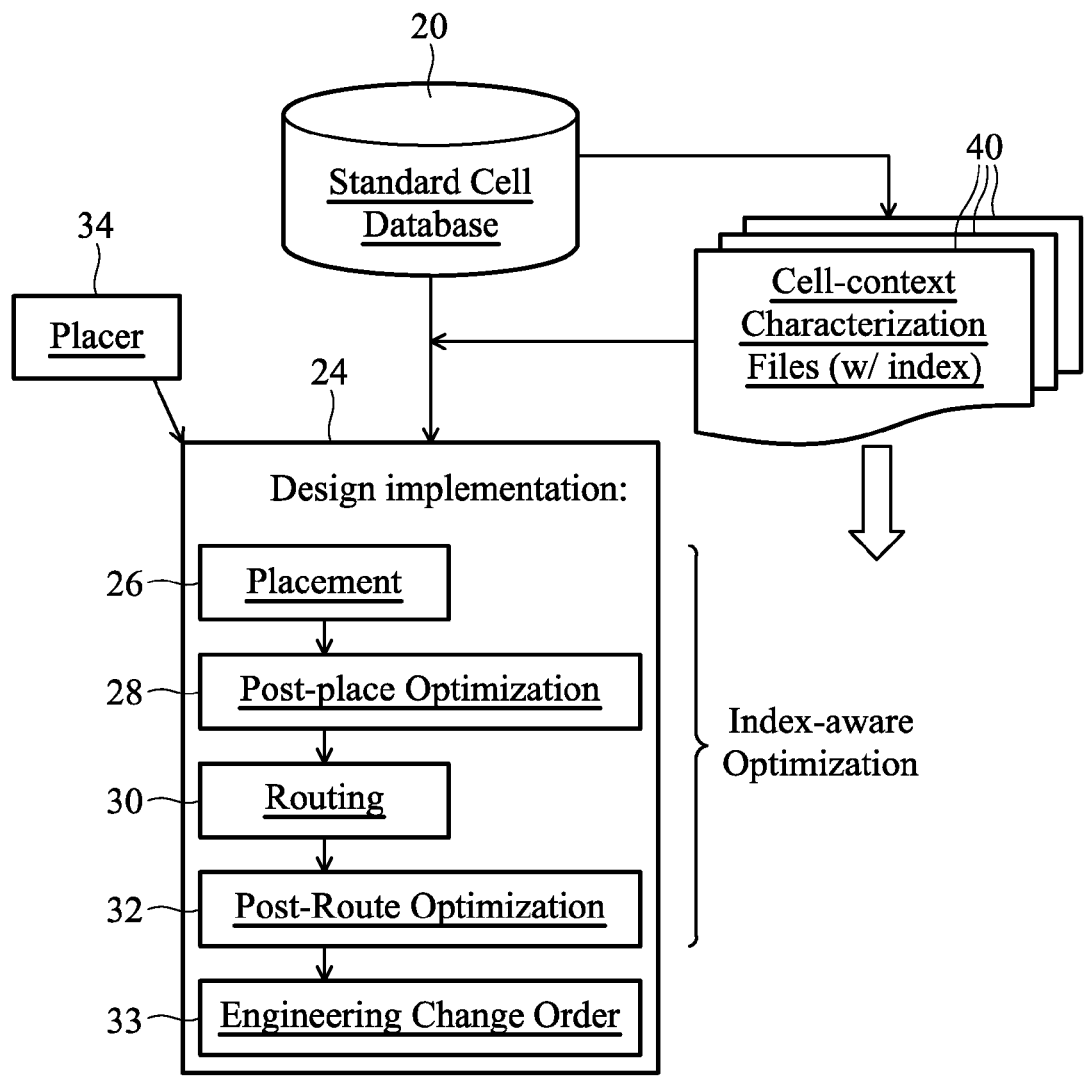
FIG. 1 illustrates an embodiment, in which cell-context characterization files are added to guide the placement-and-route in integrated circuit design.

FIG. 1 illustrates an embodiment. Standard cell database 20 is used to store standard cells. When an integrated circuit is designed, standard cells are retrieved from standard cell database 20 and are placed and routed (block 24). In an embodiment, the placement-and-route of the integrated circuit may include placement step 26 and routing step 30. In an alternative embodiment, the placement-and-route of the integrated circuit may further include post-place optimization step 28, in which the placement (including portions of the standard cells) made in placement step 26 is modified, post-route optimization step 32 and engineering change order (ECO) step 33, in which the routing (including metal lines connecting the standard cells) made in routing step 30 is modified. Placement step 26, post-place optimization step 28, and the placement optimization performed after post-place optimization step 28 may be performed by placer 34. Throughout the description, the term "cell-context" of a standard cell is used to refer to the environment where the standard cell is located, including, but not limited to, the type of neighboring cells, the spacing from neighboring cells, well proximity, poly spacing, stress, boundary conditions, and the like. In the placement, routing, and the subsequent optimization, the cell-context is taken into consideration, and hence the respective design is referred to as a cell-context aware design.

To achieve the cell-context aware design, cell-context characterization files 40 (also referred to as cell-context files hereafter) are prepared to guide the placement-and-route, the performance evaluation, and the optimization of the design of the integrated circuit. Cell-context characterization files 40 may be stored in a storage media, which may be a hard drive, a tape, a disk, or the like. Cell-context characterization files 40 include cell-context information of the standard cells stored in the standard cell database. Cell-context characterization files 40 may include routability index files, which may be in the form of routability index tables. Routability index files may be used for the optimization of placement so that routing congestion can be reduced. Cell-context characterization files 40 may also include performance index files (tables), which may be used to accurately evaluate the performance of the integrated circuit. In addition, any other cell-context information that can help improve integrated circuit design can also be part of cell-context characterization files 40.

Figure 2:
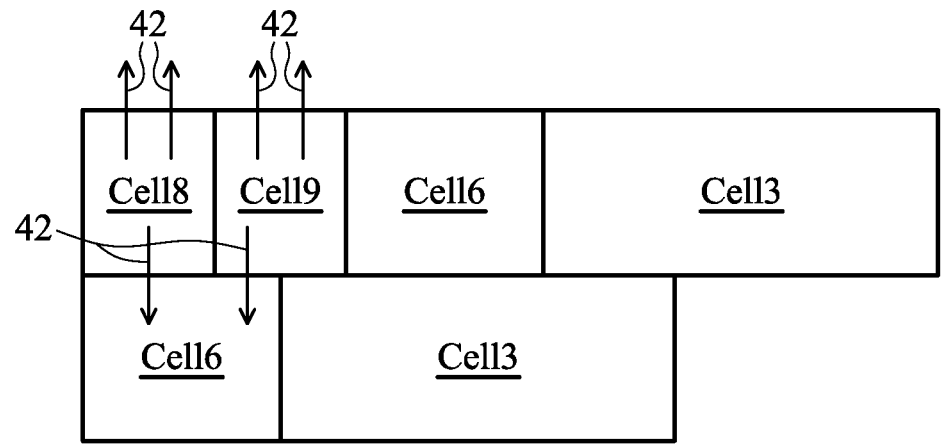
FIGS. 2 and 3 illustrate a portion of circuit design before and after the cell-context aware optimization is performed, respectively.
Figure 3:
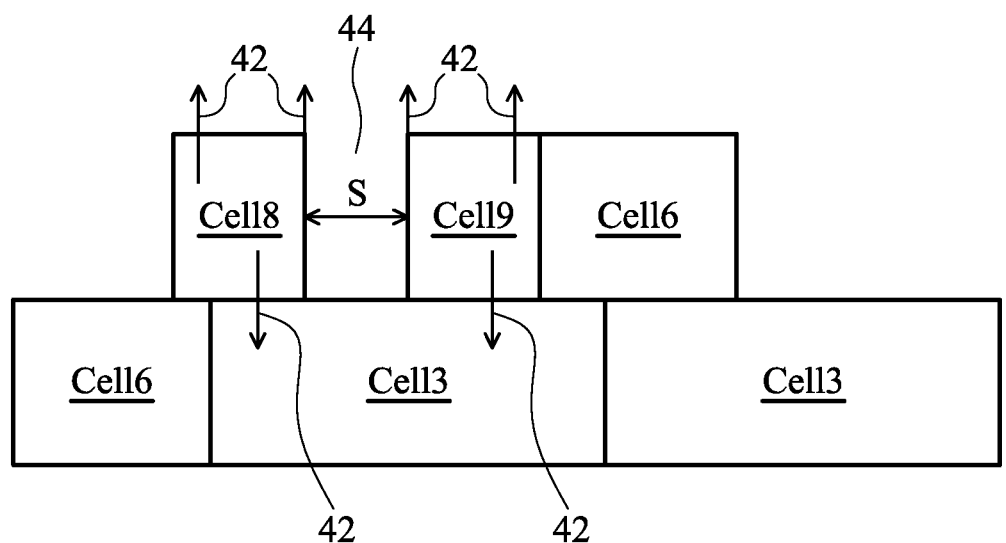

FIGS. 2 and 3 illustrate an example showing the function of the routability index file. FIG. 2 illustrates six standard cells that are placed as two rows, wherein the circuit shown in FIG. 2 may be the result after placement step 26 (refer to FIG. 1) is performed. The arrows in FIG. 2 symbolize metal lines 42 that are needed to route the connections to the illustrated standard cells Cell8 and Cell9. In the embodiment as shown in FIG. 2, metal lines 42 are congested. Accordingly, in post-place optimization step 28 (refer to FIG. 1), the placement is optimized, resulting in the circuit as shown in FIG. 3. In FIG. 3, cells Cell8 and Cell9 are separated from each other either by adding space 44, which may include a filler cell (also denoted as 44), or simply by adding a space between cells Cell8 and Cell9 (however, power lines in cells Cell8 and Cell9 may extend across space 44). After separating cells Cell8 and Cell9, metal lines 42 will no longer be congested. It is appreciated that in the optimization of the placement, other spaces may also be added to the sides of other standard cells such as cells Cell3 and Cell6, if needed, although they are not shown in FIG. 3.

Again referring to FIG. 3, the decision as whether to add space 44 may be determined based on cell-context characterization files 40. Further, if space 44 is to be added, the desirable value of spacing S may also be determined based on cell-context characterization files 40. In an embodiment, in the routability index table, there is a plurality of standard cells. Each of the standard cells is associated with one or more routability index. Therefore, for the standard cell that is being placed or optimized, a routability index may be found from a routability table. The routability index may specify the value of spacing S and whether space 44 should be added. FIG. 4A illustrates exemplary cell-context characterization file 40. For each of the standard cells listed in the routability index table, an "Abutted" index and an "Isolated" index (both are forms of routability indexes) are provided. The "Abutted" index is used if the respective standard cell listed under the "cellname," for example, Cell8, is a butting cell, and the "Isolated" index is used if the respective standard cell is an isolated cell. In an exemplary embodiment, an isolated standard cell means that in the direction of the power lines of the standard cell, at least one side of the standard cell has no other standard cell butting it, and a butting cell means that both sides (in the direction of power lines) of the respective standard cell has butting cells. It is to be realized the terms "isolated" and "butting" may be defined differently. However, if different definitions are adopted, the values in the routability index table may also change accordingly.

The routability index may indicate whether an additional space (or a filler cell) needs to be inserted between the respective standard cell and its butting cells, and indicates the value (the dimension) of the spacing if the additional space is needed. For example, cell Cell8 has an abutted index equal to 11.35 and an isolated index equal to 9.35. These relatively high indexes indicate that additional spaces need to be inserted around the cell, regardless if Cell8 is an isolated cell or a butting cell. Further, a greater index may mean that a greater value of spacing S (refer to FIG. 3) is needed. Accordingly, index 11.35 indicates that more space needs to be inserted between a butting Cell8 than an isolated Cell8, which has a routability index equal to 9.35. Further, if no space is needed, the respective routability index may be specified by a certain value. In an exemplary embodiment, if the butted index or the isolated index is relatively low, no additional space is needed when the respective cell is a butting cell or an isolated cell.

A relationship may be established to calculate the required spacing S (refer to FIG. 3) from the provided routability index. In an embodiment, the relationship may be linear, so that the required spacing S may be calculated as the product of the routability index and a pre-specified factor, wherein the pre-specified factor may be related to the technology generation for manufacturing the integrated circuit. In other embodiments, the relationship may be non-linear, with more than one factor involved.

In alternative embodiments, instead of classifying standard cells as only "isolated" and "butted," more details of the cell-context may be provided in cell-context characterization files 40. For example, FIG. 4B illustrates another embodiment, wherein standard cells stored in database 20 are divided into different classes, and may also be saved in cell-context characterization files 40. The routability indexes of a standard cell may be different if it is abutted to different classes of other standard cells. For example, assuming class1 cells are more condensed than class2 cells, the routability index A1 corresponding to class1 cells will be greater than the routability index B1 of class2 cells, meaning that greater spaces need to be inserted to the sides of a standard cell if the standard cell abuts a class1 cell instead of abutting a class2 cell.

Referring back to FIG. 1, in the above-discussed embodiments, cell-context characterization files 40 are used by placer 34 in the post-place optimization step 28. In alternative embodiments, in placement step 26, placer 34 may also access the routability index table (cell-context characterization files 40) and insert appropriate spaces when needed. In yet other embodiments, placer 34 may also access the routability index table and insert spaces during post-route optimization step 32. However, it is realized that at this stage, the improvement that can be made is limited since most of the placing and routing have been finished, and any modification to the placement may have ripple effects.

Figures 5, 6:
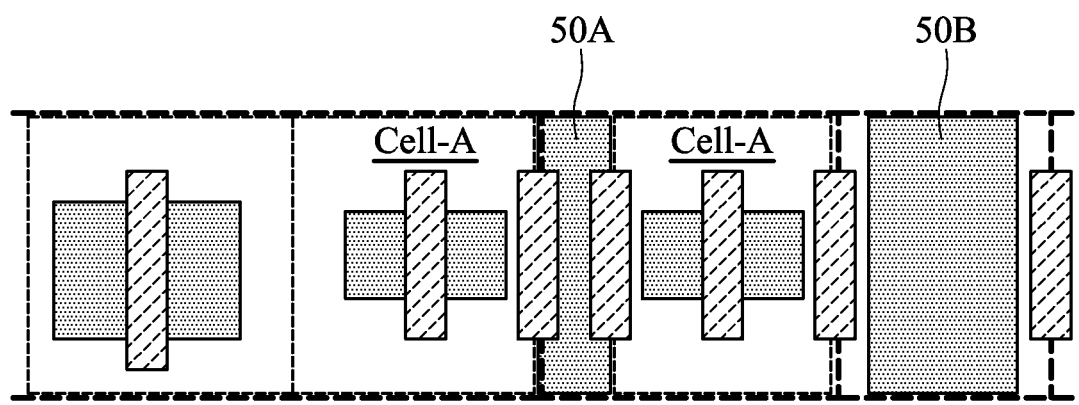
FIG. 5 illustrate an exemplary performance index table in the cell-context characterization file.
FIG. 6 illustrates a portion of a circuit design, in which spaces are inserted based on the performance evaluation performed using the performance index table.

Cell-context characterization files 40 may also include performance indexes. An exemplary performance index file (table), which is a part of cell-context characterization files 40, is shown in FIG. 5. Each of the standard cells in the performance index table as shown in FIG. 5 may have a derate-rise value and a derate-fall value, which indicate the timing of the respective standard cell (when no neighboring cells are considered) normalized to a "normal" timing of the same standard cell. The normal timing may be the average timing taking into consideration of all possible scenarios, including the spacing and the distribution probability of all other standard cells. Therefore, the normal timing may be an average timing of a distribution. The values in the performance index table may be obtained by simulations.

The exemplary derate-rise value indicates the timing of the rising edge, while the exemplary derate-fall indicates the timing of the falling edge. If the normalized derate-rise value or derate-fall value, as shown in FIG. 5, is less than 1.0, the timing of the respective standard cell is faster than the normal timing. Otherwise, if the normalized derate-rise value or derate-fall value is greater than 1.0, the timing of the respective standard cell is slower than the normal timing. Placer 34 (refer to FIG. 1), or other design tools accessing the performance index table, may thus accurately evaluate the timing of the standard cell and take appropriate action to correct the timing. For example, if the timing is shorter than desired, a different standard cell having a longer timing may be used to replace the existing standard cell. Alternatively, a delay unit may be added, or a longer metal line may be used in routing. Conversely, if the timing is shorter than desirable, a different standard cell having a longer timing may be used to replace the existing cell, or a shorter metal line may be used for routing. Alternatively, as shown in FIG. 6, spacing 50A between cells cell-A may be enlarged to the size of spacing 50B to adjust the timing.

Referring back to FIG. 1, the performance index table may be used during, or after, any of steps 26, 28, 30, and 32 to improve the circuit performance. Alternatively, the performance index table may be used after the design has finished (after design sign-off), which is also after the post-route optimization step. At this stage, some critical paths that require accurate timing may be evaluated using the performance index table. If necessary, optimization may be performed to modify the placement-and-route based on the result of the performance evaluation.

In the embodiments discussed in the preceding paragraphs, the cell-context information is stored in the form of cell-context characterization files. In alternative embodiments, the cell-context information can be stored in any other kind of form, such as an indexed database. Accordingly, the terms "cell-context characterization file" and "cell-context file" also cover all other forms. In addition, various steps discussed in preceding paragraphs, such as steps 26, 28, 30, and 32 may be performed by computers. The computers may execute program codes, which may also be stored in a storage media to perform these steps.

After the above-discussed cell-context aware integrated circuit design method is performed on an integrated circuit design, the resulting integrated circuit design (which may be a layout) is implemented on semiconductor wafers/chips to form physical integrated circuits.

The embodiments of the present invention have several advantageous features. First, the cell-context characterization files are related to specific types of standard cells, instead of being rule-based. Therefore, optimization to placement, routing, performance, and evaluation may be fine-tuned based on standard cells. The chip area usage penalty and power consumption penalty that are often associated with rule-based design are thus avoided. The cell-context characterization files are easy to expand. Further, the cell-context characterization files have a high portability and a high expandability, and can be easily adopted by different design-tool venders.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps. In addition, each claim constitutes a separate embodiment, and the combination of various claims and embodiments are within the scope of the invention.

What is claimed is:

1. A method of designing an integrated circuit, the method comprising:
   providing a standard cell database comprising a plurality of standard cells;
   providing a cell-context file comprising cell-context information indexed to the plurality of standard cells, wherein the cell-context information specifies sizes of the spaces that can be inserted between each of the plurality of standard cells and neighboring cells that are on sides of the each of the plurality of standard cells;
   retrieving the cell-context information of one of the plurality of standard cells from the cell-context file; and
   applying the cell-context information to a design of the integrated circuit, wherein the step of retrieving the cell-context information and the step of applying the cell-context information are applied by a computer.

2. The method of claim 1, wherein the cell-context file comprises a routability index table, and wherein each of the plurality of standard cells is associated with a routability index in the routability index table.

3. The method of claim 2, wherein the routability index comprises an isolation index and a butting index, wherein the isolation index specifies sizes of the spaces that can be inserted between a corresponding first indexed cell in the plurality of standard cells and abutting cells of the first indexed cell when the first indexed cell has no abutting standard cells, and wherein the butting index specifies sizes of the spaces that can be inserted between a corresponding second indexed cell in the plurality of standard cells and abutting cells of the second indexed cell when the second indexed cell has at least one abutting standard cell.

4. The method of claim 2, wherein the step of applying the cell-context information to the design of the integrated circuit comprises inserting a space to a side of the one of the plurality of standard cells, wherein a dimension of the space is related to the routability index.

5. The method of claim 4, wherein the step of inserting the space is performed during a post-place optimization step.

6. The method of claim 1, wherein the cell-context file comprises a performance index table, and wherein each of the plurality of standard cells is associated with a performance index in the performance index table.

7. The method of claim 6, wherein the step of applying the cell-context information to the design of the integrated circuit comprises using the performance index to evaluate a performance of a critical path of the integrated circuit.

8. The method of claim 7 further comprising optimizing a design of the integrated circuit based on the performance of the critical path of the integrated circuit.

9. The method of claim 6, wherein the performance index comprises a timing index.

10. A method of designing an integrated circuit, the method comprising:
    providing a standard cell database comprising a plurality of standard cells;
    providing a routability index file comprising routability indexes associated with the plurality of standard cells;
    retrieving a routability index from the routability index file, wherein the routability index corresponds to a selected standard cell in the plurality of standard cells and is used in the integrated circuit, and wherein the routability index specifies a space that can exist between the selected standard cell and neighboring cells of the selected standard cell;
    calculating a spacing based on the routability index; and
    inserting a space to a side of the selected standard cell, wherein a dimension of the space is equal to the spacing, and wherein the step of retrieving the routability index and the step of applying the cell-context information is applied by a computer.

11. The method of claim 10, wherein the routability index is selected from a group consisting essentially of an isolation index and a butting index, wherein the routability index is the isolation index when the selected standard cell is isolated in the integrated circuit and has not butting cells, and the routability index is the butting index when the selected standard cell is butted by additional standard cells in the integrated circuit.

12. The method of claim 10, wherein the routability index is selected from a plurality of class indexes associated with different classes of the plurality of standard cells.

13. The method of claim 10, wherein the step of retrieving the routability index, the step of calculating the value, and the step of inserting the space are performed in a post-place optimization step.

14. The method of claim 10, wherein the step of retrieving the routability index, the step of calculating the value, and the step of inserting the space are performed in a placement step.

15. A system for designing an integrated circuit, the system comprising:
    a standard cell database comprising a plurality of standard cells; and
    a routability index file, wherein in the routability index file, each of the plurality of standard cells is associated with a routability index, wherein the routability index specifies a space that can exist between the each of the plurality of standard cells and neighboring cells of the each of the plurality of standard cells, and wherein the routability index comprises:
        an isolation index, wherein the routability index is the isolation index when the each of the plurality of standard cells is isolated in the integrated circuit and has not butting cells; and
        a butting index, wherein the routability index is the butting index when the each of the plurality of standard cells is butted by additional standard cells in the integrated circuit.

16. The system of claim 15 further comprising a performance index file, and wherein in the performance index file, each of the plurality of standard cells is associated with a performance index.

17. The system of claim 15, wherein the routability index comprises a class index associated with a class of standard cells in the plurality of standard cells.

18. The system of claim 15 further comprising a placer configured to retrieve a routability index from the routability index file and insert a space to a side of a selected standard cell associated with the routability index, wherein the space has a dimension calculated from the routability index.

19. A system for designing an integrated circuit, the system comprising:
    a standard cell database comprising a plurality of standard cells;
    a cell-context file comprising cell-context information indexed to the plurality of standard cells, wherein the cell-context information specifies sizes of the spaces that can be inserted between each of the plurality of standard cells and neighboring cells neighboring the each of the plurality of standard cells; and
    a tool configured to retrieve the cell-context information of one of the plurality of standard cells, and apply the cell-context information to a design of the integrated circuit.

20. The system of claim 19, wherein the tool comprises a placer configured to place standard cells to form the integrated circuit.

21. The system of claim 19, wherein the cell-context file comprises a routability index table, and wherein in the routability index table, each of the plurality of standard cells is associated with a routability index.

22. The system of claim 21, wherein the routability index comprises an isolation index and a butting index, wherein the routability index is the isolation index when the each of the plurality of standard cells is isolated in the integrated circuit and has not butting cells, and the routability index is the butting index when the each of the plurality of standard cells is butted by additional standard cells in the integrated circuit.

23. The system of claim 21, wherein the routability index comprises a class index associated with a class of the plurality of standard cells.

24. The system of claim 19, wherein the cell-context information comprises a performance index table, and wherein in the performance index table, each of the plurality of standard cells is associated with a performance index.

25. The system of claim 24, wherein the performance index comprises a timing index.

26. The system of claim 25, wherein the timing index comprises a derate-rise index and a derate-fall index.

* * * * *